(12) United States Patent
Crowder et al.

(10) Patent No.: US 6,261,876 B1
(45) Date of Patent: Jul. 17, 2001

(54) PLANAR MIXED SOI-BULK SUBSTRATE FOR MICROELECTRONIC APPLICATIONS

(75) Inventors: Scott W. Crowder, Ossining; Robert Hannon, Wappingers Falls; Subramanian S. Iyer, Mt. Kisco, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,191

(22) Filed: Nov. 4, 1999

(51) Int. Cl.[7] .................................................. H01L 21/00
(52) U.S. Cl. .......................... 438/149; 438/239; 438/423; 438/425; 438/426; 438/439; 438/443; 438/450
(58) Field of Search ..................................... 438/149, 239, 438/423, 425, 426, 439, 443, 450

(56) References Cited

U.S. PATENT DOCUMENTS

| 5,343,064 | | 8/1994 | Spangler et al. . |
| 5,344,787 | * | 9/1994 | Nagalingham et al. ............. 438/450 |
| 5,494,846 | * | 2/1996 | Yamazaki ............................ 438/407 |
| 5,631,186 | | 5/1997 | Park et al. . |
| 5,811,283 | | 9/1998 | Sun . |
| 5,877,048 | * | 3/1999 | Wu ...................................... 438/423 |
| 5,877,978 | | 3/1999 | Morishita et al. . |
| 5,892,256 | | 4/1999 | Matsushita et al. . |
| 5,894,152 | | 4/1999 | Jaso et al. . |
| 5,904,535 | * | 5/1999 | Lee ...................................... 438/423 |
| 6,096,582 | * | 8/2000 | Inoue et al. ......................... 438/149 |
| 6,096,583 | * | 8/2000 | Iwamatsu et al. .................. 438/149 |
| 6,107,125 | * | 8/2000 | Jaso et al. ............................ 438/149 |
| 6,127,242 | * | 10/2000 | Batra et al. .......................... 438/439 |
| 6,174,784 | * | 1/2001 | Forbes ................................. 438/405 |
| 6,194,253 | * | 2/2001 | Bolam et al. ........................ 438/149 |

* cited by examiner

*Primary Examiner*—Richard Booth
*Assistant Examiner*—Lynne A. Gurley
(74) *Attorney, Agent, or Firm*—Connolly Bove Lodge & Hutz; Joseph P. Abate

(57) ABSTRACT

A process for creating a substrate including bulk silicon regions and semiconductor-on-insulator regions. Regions of a surface of a bulk silicon substrate are recessed above regions where it is desired to create buried oxide regions in the substrate. Implant mask regions are formed on the surface of the substrate over regions where it is not desired to create buried oxide regions. Buried oxide regions are formed in the substrate under the recessed regions in the substrate. The implant mask regions are removed, leaving bulk silicon regions between the buried oxide regions.

15 Claims, 3 Drawing Sheets

PLANAR MIXED SOI-BULK SUBSTRATE FOR MICROELECTRONIC APPLICATIONS

FIELD OF THE INVENTION

The present invention relates to semiconductor device structures that include both DRAM elements and high performance logic elements in a single structure. The present invention also relates to semiconductor device structures that include both semiconductor-on-insulator regions and bulk semiconductor regions on a single substrate.

BACKGROUND OF THE INVENTION

Semiconductor-on-insulator structures are one area of on going research in microelectronic device development. Typically, the semiconductor-on-insulator structures include silicon-on-insulator structures. Semiconductor-on-insulator, and particularly silicon-on-insulator structures, offer advantages for high performance logic devices.

SUMMARY OF THE INVENTION

The present invention provides a process for creating a substrate including bulk semiconductor regions and semiconductor-on-insulator regions. The process includes recessing regions of a surface of a bulk semiconductor substrate above regions where it is desired to create buried oxide regions in the substrate. Implant mask regions are formed on a surface of a substrate over regions where it is not desired to create buried oxide regions. Buried oxide regions are formed on the substrate under the recessed regions in the substrate. The mask implant regions are then removed, leaving bulk semiconductor regions between the buried oxide regions.

Additionally, the present invention provides a semiconductor substrate including bulk semiconductor regions and semiconductor-on-insulator regions. The substrate includes a bulk semiconductor substrate. Buried oxide regions are arranged in the substrate. Bulk semiconductor regions are arranged between the buried oxide regions. An upper surface of the substrate is planar.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
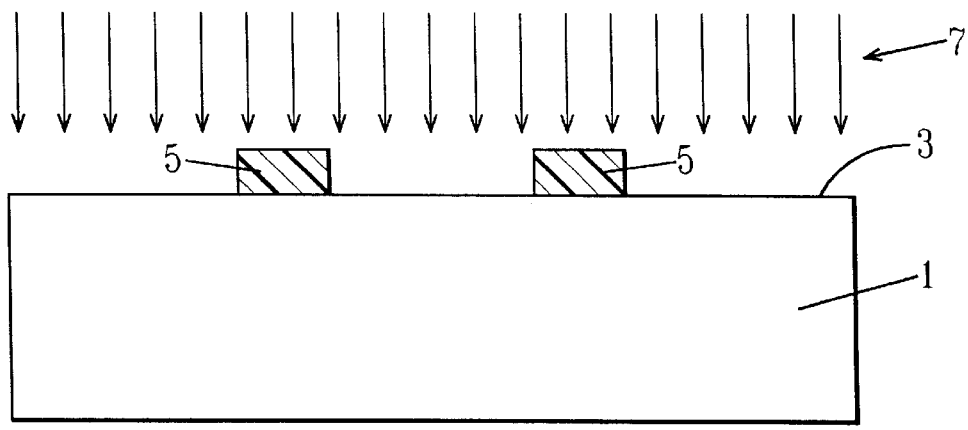
FIG. 1 represents a cross-sectional view of a semiconductor substrate in which oxygen ions are being implanted into portions of the substrate.

One area of increasing research in semiconductor device manufacture is semiconductor-on-insulator structures. Typically, currently, these structures include silicon-on-insulator (SOI) structures. Semiconductor-on-insulator structures, and particularly, silicon-on-insulator structures, offer several advantages for high performance logic devices.

Another area of research in semiconductor device manufacturing is embedded DRAM. Embedded DRAM represents a systems scale integration of DRAM and logic devices. Typically, DRAM devices have typically been formed in bulk silicon substrates. However, low signal levels in DRAM devices, coupled with very sensitive cell state read out schemes make it difficult to create robust DRAM devices with floating bodies.

While it has been proposed to form DRAM devices in SOI structures, the typically utilized trench technology involved in creating DRAM devices makes the integration of deep trench (DT) modules in semiconductor insulator structures somewhat complicated. Trench technology associated with DRAM arrays is difficult to integrate into SOI structures at least in part because the trench capacitor is deeper that the buried oxide layer in an SOI substrate. For example, trench capacitors typically have a bottom part about 1.3 $\mu$m to about 8 $\mu$m below the silicon surface that serves as the actual capacitor. In a middle part of the trench capacitors, typically about 1000 Å to about 1.3 $\mu$m below the silicon surface, an isolation collar serves to prevent the stored charge from leaking into the well structures. Also, trench capacitors typically include a top part that serves as an electrical connection to the cell and that is typically located about 400 Å to about 1000 Å below the silicon surface.

The buried oxide in an SOI substrate typically is about 2000 Å thick and is about 1000 Å to about 2000 Å below the silicon surface. This can interfere with the well and buried plate structures of the DRAM capacitor. This can also make the process of etching deep trenches difficult and even unmanufacturable.

The present invention overcomes problems associated with forming DRAM devices in SOI structures to provide a more robust DRAM. By more robust, it is meant, among other thing, that the process according to the present invention functions to be manufacturable at reasonable yields. Also, the process of the present invention is repeatable and functional to make it possible to make a robust DRAM in bulk silicon.

To overcome the above described problems as well as others, the present invention provides a method that includes fabricating DRAM arrays and associated circuits in bulk semiconductor regions of a substrate and high performance logic devices in semiconductor-on-insulator regions of the same substrate. As is apparent, the present invention includes providing both bulk semiconductor regions of the substrate as well as semiconductor-on-insulator regions in the same substrate.

By way of example, which is described herein a silicon-on-insulator structure. However, the present invention is applicable with other semiconductor materials to form other semiconductor-on-insulator structures. By discussing a specific example of a silicon-on-insulator structure, this is not meant to limit the present invention to silicon-on-insulator structures or to imply that the present invention does not have usefulness with other semiconductor-on-insulator materials.

Methods have been proposed for creating silicon-on-insulator and bulk silicon regions in a single substrate. For example, it has been previously proposed by Kesan and Iyer, NIST, 1993, the entire contents of the disclosure of which are hereby incorporated by reference, to employ patterned separation by implantation of oxygen process (SIMOX). The SIMOX process typically utilizes a high dose of oxygen ions, such as on the order of about $10^{18}$ oxygen ions per square centimeter. The high dose of oxygen ions may be combined with a high temperature anneal, such on the order of about 1325° C. to achieve a buried oxide layer and an overlying superficial silicon layer. The active devices are fabricated in the superficial silicon layer.

According to embodiments of the SIMOX process, a substrate initially may be patterned utilizing a mask to field regions of the substrate that are to retain bulk-like properties. The mask permits oxygen to be implanted in the other regions. FIG. 1 illustrates a cross-sectional view of a portion of the substrate 1 undergoing the SIMOX process.

In the structure illustrated in FIG. 1, mask regions 5 have been formed on the upper surface 3 of substrate 1. Typically, the mask regions 5 are formed of a material that can block the oxygen ions, thereby permitting penetration of the oxygen ions through the mask to permit regions under the mask to remain bulk in nature. Those of ordinary skill in the art would be able to determine mask materials to utilized in this application without undue experimentation. Along these lines, examples of mask materials include $SiO_2$ and $Si_3N_4$.

After forming and patterning the mask, oxygen ions ($O^+$) may be implanted into the substrate 1. Arrows 7 indicate the oxygen ions directed toward the substrate.

Figure 2:
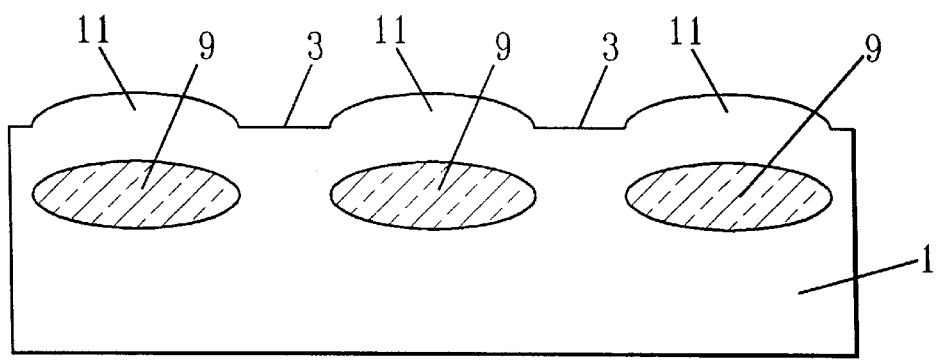
FIG. 2 represents a cross-sectional view of the structure illustrated in FIG. 1 after implantation of the oxygen ions in the substrate, thereby forming oxide regions of the substrate.

FIG. 2 illustrates the substrate after implantation of the oxygen ions, removal of the mask regions, and anneal. Implantation of the oxygen ions has resulted in oxide regions 9 being formed in the substrate 1. Formation of the buried oxide regions 9 in the substrate has an associated concomitant increase in the volume of the substrate in those regions due to the increased volume of the buried oxide. The masked regions do not have such an associated volume increase since they were protected by the mask regions.

The volume increase in the substrate can result in regions 11 extending above the surface 3 of the substrate 1. As a result, the upper surface of the substrate will be non-planar. Typically, regions 11 can cause the upper surface 3 of the substrate to rise about one-half of the thickness of the buried oxide regions.

A non-planar surface such as the surface that may result from implanting oxide regions can introduce a variety of problems for VLSI technology. These problems include the limited depth of focus of deep submicron lithographic exposure tools. Also, process modules typically utilized in modular VLSI technology require planar starting surfaces.

As a result, the non-planar surface created in the substrate can considerably impact if not make impossible carrying out certain further processing steps on the substrate, such as creating memory and/or logic devices in the substrate.

The present invention provides a method for forming buried oxide regions while avoiding the associated non-planar surface created during implant of the buried oxide regions. Broadly, the present invention recesses the surface of the substrate prior to buried oxide implantation to counteract the effects of the buried oxide implantation, which tend to raise the surface of the substrate. In other words, the present invention creates or introduces a reverse topography on the surface of the substrate prior to implanting the buried oxide regions, whether by the SIMOX process or another process.

Along these lines, in regions of the surface of a bulk silicon substrate recesses may be created above regions where it is desired to create buried oxide regions in the substrate. Any number of processes may be utilized to form the recesses in the surface of the substrate. According to one process, a recessed oxide (ROX) may be grown on the substrate overlying regions where the buried oxide is to implanted. The ROX process typically results in a "bird's beak" structure, which may be advantageous in the present application. The bird's beak may be advantageous since it is essentially an edge thinning so that there is not an abrupt step, but rather a transition area from the buried oxide to the bulk silicon.

Figure 3:
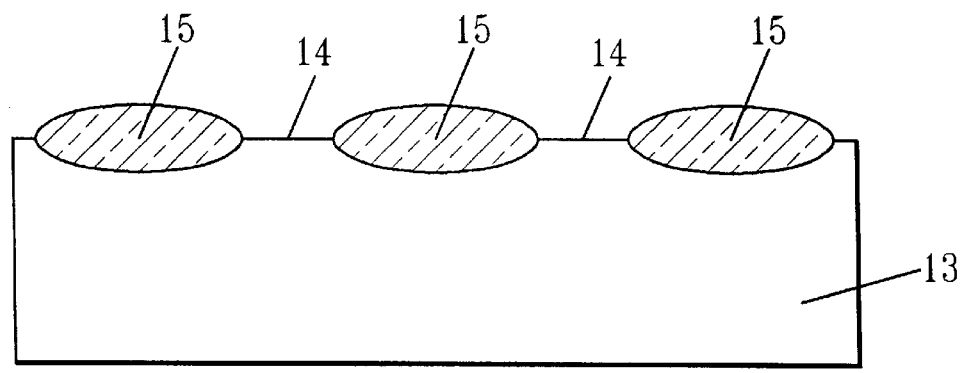
FIG. 3 represents a cross-sectional view of a semiconductor substrate in which recessed oxide regions have been formed.

FIG. 3 illustrates a cross-sectional view of an embodiment of a substrate 13 in which ROX regions 15 have been created. As can be seen in FIG. 3, the ROX process also results in an increased volume where the oxide is implanted. Furthermore, the oxide extends down below the upper surface 14 of the substrate 13 as can be seen in FIG. 3.

Figure 4:
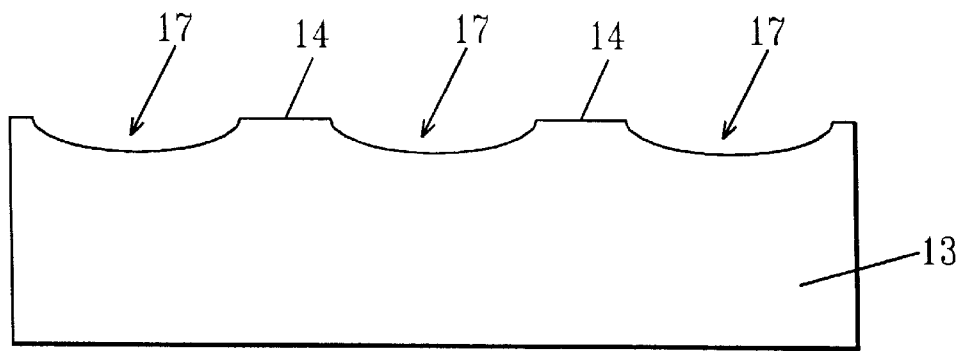
FIG. 4 represents a cross-sectional view of the structure illustrated in FIG. 3 after removal of the reverse oxide regions.

According to this embodiment of the process of the present invention, after formation of the ROX regions, the oxide regions 15 are stripped from the substrate 13. FIG. 4 illustrates an example of a structure after removal of the ROX regions. Removal of the ROX regions creates recesses 17 below the surface 14 of the substrate 13. These recesses 17 are arranged over regions of the substrate 13 where the buried oxide regions will be created.

As can be seen in FIG. 4, after stripping of the ROX regions, topography exists on the surface of the wafer. This topography may preclude any fine lithography and limit the dimensions of the patterned regions to several times the minimal lithographic dimension. Typically, at this stage in the processing, the topography does not pose any problems since other factors, such as the minimum required size of the patterned regions and the requirement of a dislocation buffer zone at the boundary, for example, will require super minimal dimension patterns.

After creating recesses in the surface of the substrate 13, a mask may be applied to be utilized in forming the buried oxide regions. Typically, the pattern of recesses formed in the surface of the substrate and the block mask utilized in the buried oxide process are complimentary to each other.

According to some embodiments, it may be desired that after formation of recesses 17 in substrate 13 to provide the substrate with a planar surface prior to forming the block mask utilized in the SIMOX process. Providing a planar surface to the substrate may be carried out according to a variety of processes. According to one example, at least the depressions 17 in the substrate 14 may be filled in with a material. Typically, the material filling the depression 17 is different from the material that is to be utilized to form the block mask. By making the materials different, the material filling the depressions may be removed prior to implantation of oxygen ions to create the buried oxide regions. Along these lines, the material filling the depressions may be preferentially etched off prior to implantation of the buried oxide regions in the substrate.

Examples of materials that may be utilized to fill the depressions as well as materials that may be utilized in the block mask include $SiO_2$ and $Si_3N_4$.

Figure 5:
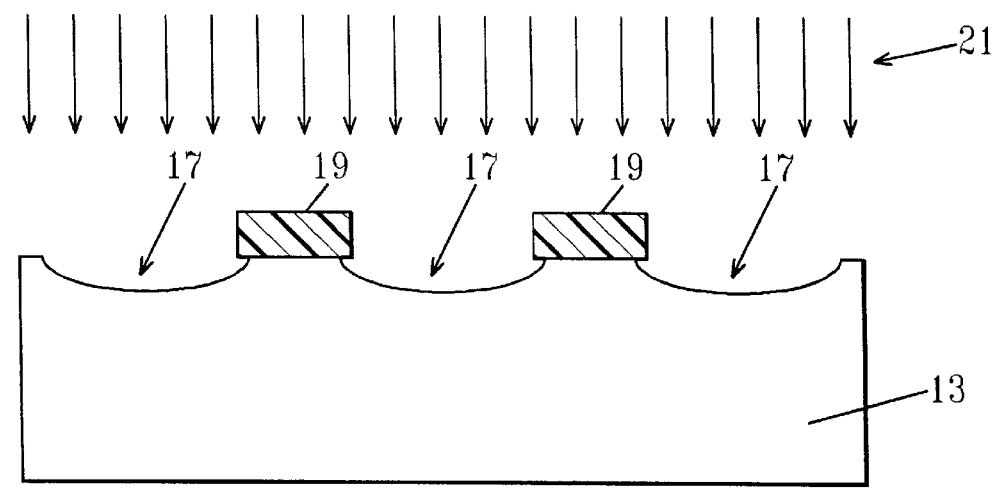
FIG. 5 represents a cross-sectional view of the structure illustrated in FIG. 4 wherein oxygen ions are being selectively implanted into portions of the substrate.

The oxygen ions may then be implanted to form buried oxide regions. FIG. 5 illustrates a cross-sectional view of a substrate 13 including depressions 17. Block mask regions 19 have been formed on the remaining planar upper surface regions 14 illustrated in FIG. 4. Oxygen ions may be directed toward the substrate 13 as indicated by arrows 21.

According to the SIMOX process, forming the buried oxide regions typically includes utilizing a dose of oxygen ions of about $10^{16}$ ions per square centimeter to about a few times $10^{18}$ ions per square centimeter. More particularly, the dose of oxygen ions is about $10^{18}$ ions per square centimeter. The energy with which the ions may be implanted can vary. Typically, the energy is more than about 10 KeV to less than about 1000 KeV. More typically, the energy level is about a few 10's of KeV to a few 100's of KeV. The energy level utilized may depend upon the top silicon thickness among other factors. Additionally, the anneal temperature utilized in the SIMOX process may be about 1200° C. to about 1350° C. More particularly, the anneal temperature is about 1325° C. However, the anneal temperature may be greater than about 1350° C.

As the buried oxide regions are formed, the volume of the substrate beneath the recessed regions will increase as illustrated in FIG. 2. However, since the recesses 17 have been formed in the surface of the substrate, increasing volume of the substrate will result in raising the level of the substrate where the recesses were created. Raising the level of the surface of the substrate where the recesses have been created basically ends up reestablishing a planar surface on the substrate.

Figure 6:
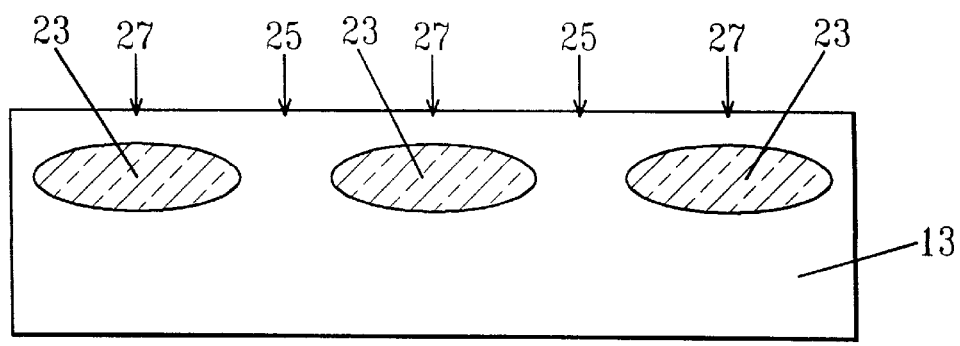
FIG. 6 represents a cross-sectional view of the structure illustrated in FIG. 5 after implantation of the oxygen ions.

After implantation of the buried oxide regions, the implant mask regions 19 typically are removed. FIG. 6 illustrates an embodiment of the structure according to the present invention after $O^+$ implantation and block mask strip. The structure illustrated in FIG. 6 includes buried oxide regions 23.

In some instances, minor polishing may be carried out on the surface of the substrate. This polishing typically occurs, if necessary, at the boundaries between where the recessed regions occurred and where the remaining planar regions 14 on the surface of the substrate 13 existed. There may be small cusps at the boundaries between these regions. To eliminate the small cusps, the surface may be lightly touch polished.

At this stage in the process, it may be necessary or desirable to apply dislocation filters to prevent polarization of dislocations from the SIMOX region into the bulk areas. How to perform this is discussed in U.S. patent application Ser. No. 09/197,639, to Robert Hannon, Subramian S. Iyer, Scott R. Stiffler, and Kevin R. Winstel, for METHOD FOR FILTERING DISLOCATION IN MERGED SOI/DRAM CHIPS, filed Nov. 23, 1998, the entire contents of the disclosure of which is hereby incorporated by reference.

Any further processing, whether applying dislocation filter, touch polishing, or creating logic or memory structures in substrate typically is done with careful attention to both the bulk and SOI processing so as to not disturb the structure that has been created.

After forming the structure such as that illustrated in FIG. 6, DRAM array elements and associated circuitry may be formed in the bulk silicon regions 25 in the substrate 13. Additionally, high performance logic elements may be formed in the semiconductor-on-insulator regions 27.

As is apparent from the above, the present invention also provides a semiconductor substrate that includes bulk semiconductor regions and semiconductor-on-insulator regions. The substrate includes a bulk semiconductor substrate. Buried oxide regions are arranged below the surface of the substrate. Bulk semiconductor regions are arranged between the buried oxide regions. An upper surface of the substrate is planar. Just as above where the example was provided where the semiconductor involved the structure with silicon, the structure according to the present invention may include silicon. However, this does not preclude embodiments including other semiconductors.

The structure according to the present invention may include dislocation filters between the buried oxide regions and the bulk substrate regions. A substrate according to the present invention may also include DRAM elements and associated circuitry in the bulk silicon regions and high performance logic elements in the semiconductor-on-insulator regions.

Figure 7:
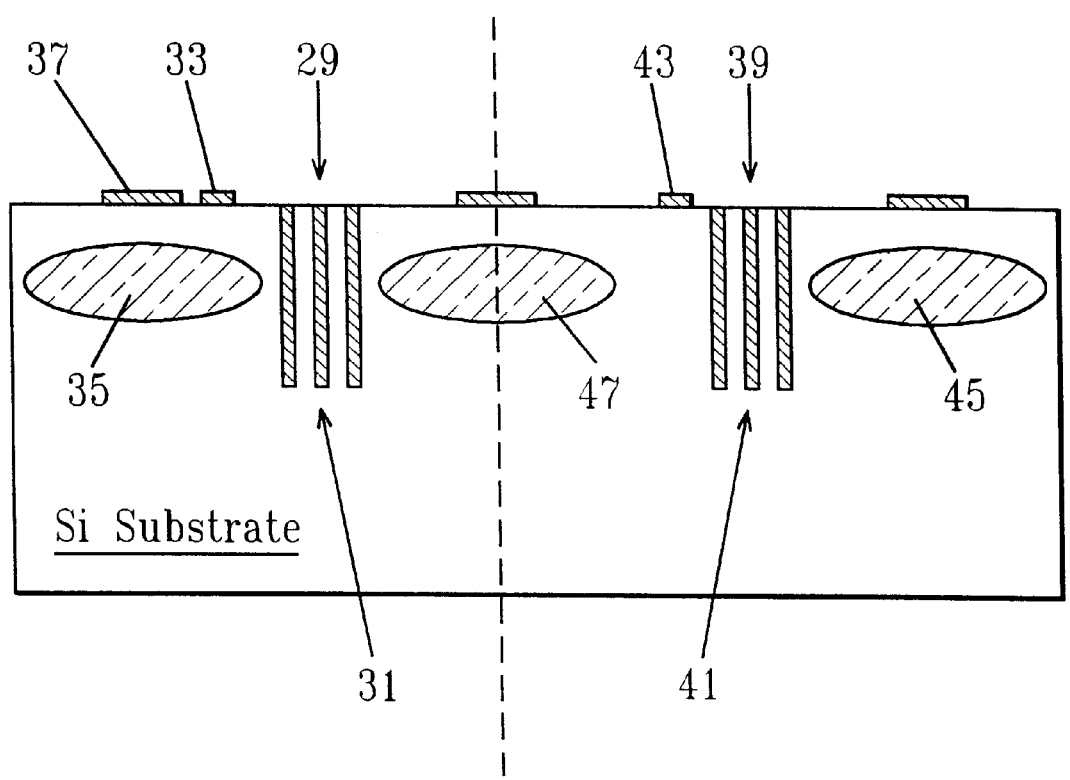
FIG. 7 represents a cross-sectional view of an embodiment of a structure that includes a DRAM array in bulk silicon and associated circuitry elements and logic devices on SOI regions and associate circuitry on bulk silicon.

FIG. 7 represents a cross-sectional view of an embodiment of a structure that includes a DRAM array in bulk silicon and associated circuitry elements and logic devices on SOI regions and associate circuitry on bulk silicon. The left hand side of FIG. 7 illustrates a DRAM array 29 formed in a bulk silicon region 31. DRAM support structures 33 are formed on the SOI region 35. Logic structures 37 are also formed on the SOI region 35. On the other hand, the right hand side of FIG. 7 illustrates a DRAM array 39 formed in a bulk silicon region 41. In this portion of the structure, the DRAM support structures 43 are formed on the bulk silicon region 41 of the substrate. The right hand side of the structure illustrated in FIG. 7 also includes SOI region 45. SOI region 47 extends between the two sides of the structure.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for creating a substrate including bulk silicon regions and semiconductor-on-insulator regions, the process comprising:

recessing regions of a surface of a bulk silicon substrate above regions where it is desired to create buried oxide regions in the substrate;

forming implant mask regions on the surface of the substrate over regions where it is not desired to create buried oxide regions;

forming buried oxide regions in the substrate under the recessed regions in the substrate; and removing the implant mask regions, leaving bulk silicon regions between the buried oxide regions.

2. The process according to claim 1, wherein recessing regions of a surface of a bulk silicon substrate comprises:

growing a plurality of reverse oxide regions extending into the bulk silicon substrate above regions where it is desired to create buried oxide regions in the substrate; and stripping the reverse oxide regions, resulting in the recessed regions in the surface of the substrate where the reverse oxide regions are removed.

3. The process according to claim 1, further comprising:

providing a planar surface to the substrate prior to forming the implant mask regions.

4. The process according to claim 3, wherein providing the planar surface comprises filling in the recessed regions in the substrate surface prior to forming the implant mask regions.

5. The process according to claim 4, further comprising removing the recess filling material after forming the implant mask regions.

6. The process according to claim 3, wherein filling in the recessed regions comprises depositing a material in the recessed regions.

7. The process according to claim 6, further comprising removing the recess filling material after forming the implant mask regions.

8. The process according to claim 4, wherein the recess filling material is a different material than material utilized to form the implant mask regions.

9. The process according to claim 7, wherein the recess filling material is preferentially etched off prior to forming buried oxide regions in the substrate under the recessed regions in the substrate.

10. The process according to claim 1, further comprising:

polishing portions of the substrate surface after removing the implant mask regions.

11. The process according to claim 1, further comprising:

forming dislocation filters to prevent the proliferation of dislocations from the buried oxide regions into surrounding bulk substrate regions.

12. The process according to claim 1, wherein forming the buried oxide regions comprises:

utilizing a dose of oxygen ions of about $10^{16}$ ions per square centimeter to about $10^{18}$ ions per square centimeter at an energy level of more than about 10 KeV to less than about 1000 KeV; and annealing the substrate at a temperature of about 1200° C. to about 1350° C.

13. The process according to claim 12, wherein the dose of oxygen ions is about $10^{18}$ ions per square centimeter and the anneal temperature is about 1325° C.

14. The process according to claim 1, further comprising:

forming DRAM array elements and associated circuitry in the bulk silicon regions; and forming high performance logic elements in the semiconductor-on-insulator regions.

15. The process according to claim 1, wherein the semiconductor-on-insulator regions comprise silicon-on-insulator regions.

* * * * *